(12) United States Patent
Kang et al.

(10) Patent No.: US 7,903,227 B2
(45) Date of Patent: Mar. 8, 2011

(54) BACKLIGHT UNIT AND LIQUID CRYSTAL DISPLAY DEVICE INCLUDING THE SAME

(75) Inventors: Joon Kang, Seoul (KR); Jin Hyun Cho, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 568 days.

(21) Appl. No.: 11/862,274

(22) Filed: Sep. 27, 2007

(65) Prior Publication Data

US 2008/0100790 A1  May 1, 2008

(30) Foreign Application Priority Data

Oct. 27, 2006 (KR) ......................... 10-2006-0105136
Feb. 12, 2007 (KR) ......................... 10-2007-0014310

(51) Int. Cl.
*G02F 1/1333* (2006.01)
(52) U.S. Cl. ..................... 349/161; 362/294; 362/373
(58) Field of Classification Search .................. None
See application file for complete search history.

(56) References Cited

U.S. PATENT DOCUMENTS

2005/0180142 A1  8/2005  Tsai

FOREIGN PATENT DOCUMENTS

| EP | 1619656 A2 | 1/2006 |
|---|---|---|
| JP | 2001-356294 A | 12/2001 |
| JP | 2003076287 A | 3/2003 |
| JP | 2006278041 A | 10/2006 |
| KR | 10-2006-0104081 A | 10/2006 |
| WO | WO 2006013760 A1 | 2/2006 |

*Primary Examiner* — Richard H Kim
(74) *Attorney, Agent, or Firm* — Sughrue Mion, PLLC

(57) ABSTRACT

A backlight unit and a liquid crystal display device are provided. The backlight unit includes light emitting diodes; and a plurality of temperature adjusting members which reduce a temperature difference formed by emission of heat of the backlight unit, the heat being caused by a convection current of air in a vicinity of the light emitting diodes and by heat emitted from the plurality of light emitting diodes. The liquid crystal display device includes a plurality of circuit boards which are provided with light emitting diodes; a frame on which the circuit boards are installed; and a plurality of temperature adjusting members provided between the plurality of circuit boards and the frame, wherein the plurality of temperature adjusting members having different heat resistances are arranged according to a temperature distribution of heat emitted from the light emitting diodes such that a uniform temperature distribution is maintained across the display device.

31 Claims, 19 Drawing Sheets (5 of 19 Drawing Sheet(s) Filed in Color)

BACKLIGHT UNIT AND LIQUID CRYSTAL DISPLAY DEVICE INCLUDING THE SAME

CROSS-REFERENCE TO RELATED APPLICATION

This application claims priority from Korean Patent Application No. 10-2006-0105136, filed on Oct. 27, 2006, in the Korean Intellectual Property Office, and Korean Patent Application No. 10-2007-0014310, filed on Feb. 12, 2007, in the Korean Intellectual Property Office, the disclosures of which are incorporated herein by reference in their entirety.

BACKGROUND OF THE INVENTION

1. Field of the Invention

Devices consistent with the present invention relate generally to a liquid crystal display devices, and more particularly to liquid crystal display devices which are capable of uniformly maintaining brightness by uniformly distributing a temperature formed by heat emitted in a body of the liquid crystal display device.

2. Description of the Prior Art

Recently, related art flat-panel display devices such as a liquid crystal display (LCD) device, a plasma display panel (PDP), and an organic light emitting diode (OLED) have been mainly developed instead of the conventional cathode ray tube (CRT) display devices.

Among them, the related art LCD device includes a thin-film transistor substrate, a color-filter substrate, and a liquid crystal panel having liquid crystal injected between the thin-film transistor substrate and the color-filter substrate.

Since the related art LCD device is a non-emissive device, a backlight unit is positioned at a rear portion of the thin-film transistor substrate so as to provide light to the LCD device. In addition, a transmittance of light irradiated from the backlight unit is adjusted according to an alignment state of the liquid crystal.

In addition, the related art LCD device further includes a chassis accommodating the liquid crystal panel and the backlight unit therein.

Light sources used in the backlight unit include a cold cathode fluorescent lamp (CCFL), an external electrode fluorescent lamp (EEFL), a flat fluorescent lamp (FFL), and a light emitting diode (LED). Recently, since the LED has high color reproducibility, a long life span, and low power consumption among the light sources, the LED has been mainly used as a light source of the backlight unit.

The backlight unit may be classified into an edge-light type backlight unit and a top-down type backlight unit according to a position of the LED. The edge-light type backlight unit has a structure in which a light source is installed in a side surface of a light guide plate, and is mainly employed for a small-size LCD device such as a laptop computer, or a desktop computer. Such an edge-light type backlight unit has superior uniformity of light and superior endurance, and is suitable for a slim LCD device.

As a size of the LCD devices has increased, the top-down type backlight unit has been actively developed. The top-down type backlight unit has a structure in which at least one light source is arranged at a rear portion of the liquid crystal panel so as to irradiate light onto the entire surface of the liquid crystal panel.

The related art LCD devices have a structure in which a heat emitting member is provided at a rear portion of a substrate having light sources arranged thereon so as to discharge heat, which is generated from the light sources, to the rear portion of the heat emitting member. However, the temperature distribution in the vicinity of the light sources is such that a temperature in an inner upper portion of the LCD device is higher than a temperature in an inner lower portion of the LCD device, and a temperature in a center portion of the LCD device is remarkably higher than a temperature in both sides of the LCD device due to a convection current phenomenon.

The irregular temperature distribution affects an optical power of the light source. Especially, the optical power is excessively changed according to temperatures in the case of a light source emitting red color light. Accordingly, when a user views an image projected on the liquid crystal panel, the image seems to be irregular and stained.

In addition, a life span of the LED is affected by the temperature. In other words, an LED under high temperature has a shorter life span compared with a life span of a light emitting diode under low temperature. Accordingly, if the temperature difference in the inside of the LCD device is excessive, dead light emitting diodes may exist together with active light emitting diodes in one LCD device.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

An object of the present invention is to provide a liquid crystal display device, capable of uniformly maintaining a temperature distribution in the liquid crystal display device, thereby removing non-uniformity of color density and color brightness.

Another object of the present invention is to provide a liquid crystal display device, capable of equalizing life spans of light emitting diodes installed in one liquid crystal display device.

According to an aspect of the present invention, there is provided a liquid crystal display device including circuit boards which are equipped with light emitting diodes, a frame on which the circuit boards are installed, and temperature adjusting members which have different heat resistance and are provided between the circuit boards and the frame, wherein the temperature adjusting members are arranged according to temperature distribution formed by heat emitted from the light emitting diodes such that the temperature distribution is uniformly maintained in the liquid crystal display device.

The plurality of the temperature adjusting members may be provided and attached to one surface of the frame such that the temperature adjusting members are spaced apart from each other by a distance, and the temperature adjusting members may be arranged such that a heat resistance thereof increases from a high temperature part to a low-temperature part in a region where the light emitting diodes are mounted.

The temperature adjusting member may be prepared in a form of a pad having an elongated shape, and a thickness of the temperature adjusting member may become thick from the high temperature part to the low-temperature part in the region where the light emitting diodes are mounted.

The temperature adjusting members may include materials having different heat transfer coefficients such that the heat transfer coefficients become lowered from the high-temperature part to the low-temperature part in the region where the light emitting diodes are mounted.

A plurality of the temperature adjusting members may be provided at one surface of the frame such that the temperature adjusting members are spaced apart from each other by a distance lengthwise and widthwise of the frame, and a thickness of the temperature adjusting members may increase from a high-temperature part to a low-temperature part in the region where the light emitting diodes are mounted, thereby sequentially increasing heat resistance values of the temperature adjusting members.

The temperature adjusting member may include an insulating material.

The temperature adjusting member may include polystyrene resin or polyurethane resin.

According to another aspect of the present invention, there is provided a liquid crystal display device comprises a backlight unit. The backlight unit includes light emitting diodes, circuit boards to which the light emitting diodes are attached, temperature adjusting members attached to rear portions of the circuit boards so as to transfer heat emitted from the light emitting diodes, and a frame to which the temperature adjusting member is attached, wherein a heat resistance of the temperature adjusting members varies according to a temperature distribution caused by heat emitted from the light emitting diodes such that the temperature distribution around the light emitting diodes in the liquid crystal display device is uniformly maintained.

Heat resistance of the temperature adjusting members may increase from a high-temperature part to a low-temperature part in a region where the light emitting diodes are mounted.

Thickness of the temperature adjusting member may become thick from the high-temperature part to the-low temperature part in a region where the parts on which the light emitting diodes are mounted.

A thickness of the temperature adjusting members may become thicker from an upper center portion of the frame to an upper peripheral portion of the frame, thereby increasing heat resistance.

The thickness of the temperature adjusting member may become thicker from a center of the frame to both sides of the frame so as to increase heat resistance thereof, and the thickness of the temperature adjusting member may become thicker from an upper portion of the frame to a lower portion of the frame so as to increase heat resistance thereof.

A plurality of temperature adjusting members may be prepared in an elongated shape while being spaced apart from each other by a distance in a longitudinal direction of the frame, and a heat resistance of the temperature adjusting members may increase from an upper portion of the frame to a lower portion of the frame.

Thickness of the temperature adjusting member may become thicker from the upper portion of the frame to the lower portion of the frame.

A plurality of the temperature adjusting members may be prepared while being spaced apart from each other by a distance lengthwise and widthwise of the frame, and a heat transfer coefficient of the temperature adjusting members may be reduced from an upper portion of the frame to a lower portion of the frame, and from a center portion of the frame to both sides of the frame, thereby increasing heat resistance of the temperature adjusting member.

The thickness of the temperature adjusting members may become thicker from the upper portion of the frame to the lower portion of the frame, and from the center portion of the frame to both sides of the frame.

The plurality of circuit boards and the plurality of temperature adjusting members may be prepared, the temperature adjusting members may be attached to a portion of the circuit boards, and a portion of the circuit board without the temperature adjusting members is directly attached to the frame such that heat conductivity toward the frame is changed according to the circuit boards.

According to another aspect of the present invention, there is provided a backlight unit includes light emitting diodes, and temperature adjusting members which reduce a temperature difference formed by emission heat of the backlight unit which is caused by heat emitted from the light emitting diodes and a convection current of air in a vicinity of the light emitting diodes.

The backlight unit may further comprise a plurality of circuit boards equipped with the light emitting diodes, to which the temperature adjusting members are attached, and a frame on which the circuit boards and the temperature adjusting members are installed, and a heat resistance of the temperature adjusting members may increase from a high-temperature part to a low-temperature part in a region where the light emitting diodes are mounted.

The temperature adjusting members may include a thermal insulator, and a thickness of the temperature adjusting members may sequentially increase from the high-temperature part toward the low-temperature part in the region where the light emitting diodes are mounted.

A thermal conductivity of the temperature adjusting members may sequentially decrease from the high-temperature part to the low-temperature part in the region where the light emitting diodes are mounted.

According to another aspect of the present invention, there is provided a liquid crystal display device comprises a light guide plate for guiding light, light emitting diodes provided in a vicinity of the light guide plate so as to irradiate light toward the light guide plate, circuit boards equipped with the light emitting diodes, a frame on which the circuit boards are installed, and temperature adjusting members provided between the circuit boards and the frame, wherein the temperature adjusting members have different heat resistance according to a installation position thereof such that the temperature distribution formed in a vicinity of the circuit board due to heat radiation of the light emitting diodes is uniformly maintained.

The temperature adjusting may be prepared in a pad shape between the circuit board and the frame, and a heat resistance of the temperature adjusting members installed in a high-temperature part, on which emission heat from the light emitting diode is concentrated, is lower than a heat resistance of the temperature adjusting members installed at a low-temperature part, on which the emitted heat is scattered, thereby reducing a temperature difference between the high-temperature part and the low-temperature part.

The circuit boards may include a first circuit board provided at an upper portion of the light guide plate and a second circuit board provided at a lower portion of the light guide plate, and a heat resistance of a first temperature adjusting member arranged on the first circuit board may be lower than a heat resistance of a second temperature adjusting member arranged on the second circuit board.

The first and second circuit boards may be divided into a plurality of first and second circuit board groups, and temperature adjusting members arranged at center portions of the first and second circuit board groups may have a heat resistance lower than a heat resistance of temperature adjusting members arranged at peripheral portions of the first and second circuit board groups.

The temperature adjusting members may include a pad having an insulating material, and a thickness of a first temperature adjusting member may be thinner than a thickness of a second temperature adjusting member.

The temperature adjusting member may include polystyrene resin or polyurethane resin.

A heat transfer coefficient of the first temperature adjusting member may be lower than a heat transfer coefficient of the second temperature adjusting member such that heat dissipation in the first circuit board is achieved more smoothly than heat dissipation in the second circuit board is achieved.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The above and other aspects of the present invention will be more apparent from the following detailed description taken in conjunction with the accompanying drawings, in which.

DETAILED DESCRIPTION OF EXEMPLARY EMBODIMENTS OF THE PRESENT INVENTION

Hereinafter, exemplary embodiments of the present invention will be described with reference to the accompanying drawings.

Figure 1:
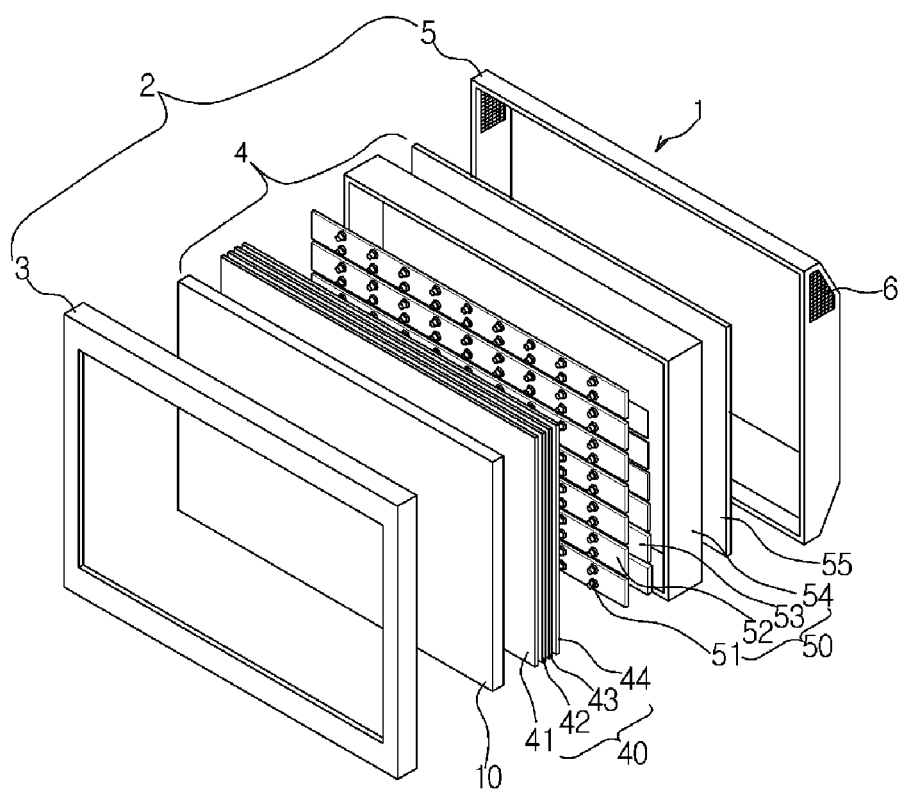
FIG. 1 is an exploded perspective view showing a liquid crystal display device including a top-down type backlight unit according to an exemplary embodiment of the present invention.

As shown in FIG. 1, the external appearance of a liquid crystal display device 1 according to an exemplary embodiment of the present invention is formed by a chassis 2. The chassis 2 includes a first chassis 3, a center portion 4, and a second chassis 5 coupled with the first chassis 3. The center portion 4 is shown exploded in the figure. The second chassis 5 is provided at upper lateral portions with air holes 6 for ventilating air.

A liquid crystal panel 10 is provided at a rear portion of the first chassis 3, and a light transfer unit 40 and a backlight unit 50 are installed at a rear of the liquid crystal panel 10. The light transfer unit 40 converts light irradiated from a backlight unit 50 (to be described later) so as to transfer the light to the liquid crystal panel 10. The backlight unit 50 is provided at a rear portion of the light transfer unit 40 so as to provide the light to the liquid crystal panel 10.

The light transfer unit 40 includes a protect sheet 41, a prism sheet 42, a diffusion plate 43, and a reflector plate 44. The functions and the details of the components will be described later.

The backlight unit 50 includes light emitting diodes 51 emitting light, circuit boards 52 on which the light emitting diodes 51 are arranged, temperature adjusting members 53 provided at a rear portion of the circuit boards 52 so as to adjust the transfer rate of heat emitted from the light emitting diodes 51 and evenly distribute the internal temperature of the liquid crystal display device, and a frame 54 having the temperature adjusting members 53 attached thereto. A heat emitting member 55 is provided at a rear portion of the frame 54 to discharge heat to an exterior of the liquid crystal display device 1.

In addition, the light emitting diodes 51 are provided on the circuit board 52 while being spaced apart from each other by a distance. The distance may be predetermined.

The circuit board 52 is prepared in an elongated panel shape. A plurality of circuit boards 52 having the panel shape are prepared, and the temperature adjusting members 53 are attached to rear portions of the circuit boards 52, respectively, while corresponding to the shape of the circuit boards 51. In this state, the temperature adjusting members 53 are attached to the front surface of the frame 54, thereby fixing the circuit boards 52 to the frame 54.

The circuit boards 52 include a printed circuit board (PCB) or a metal core printed circuit board (MCPCB), and are attached to the front surface of the frame 54 in plural lines while being spaced apart from each other by a distance in a width direction. The distance may be predetermined.

In addition, the temperature adjusting members 53 have a same shape and a same arrangement as those of the circuit boards 52.

Figure 2:
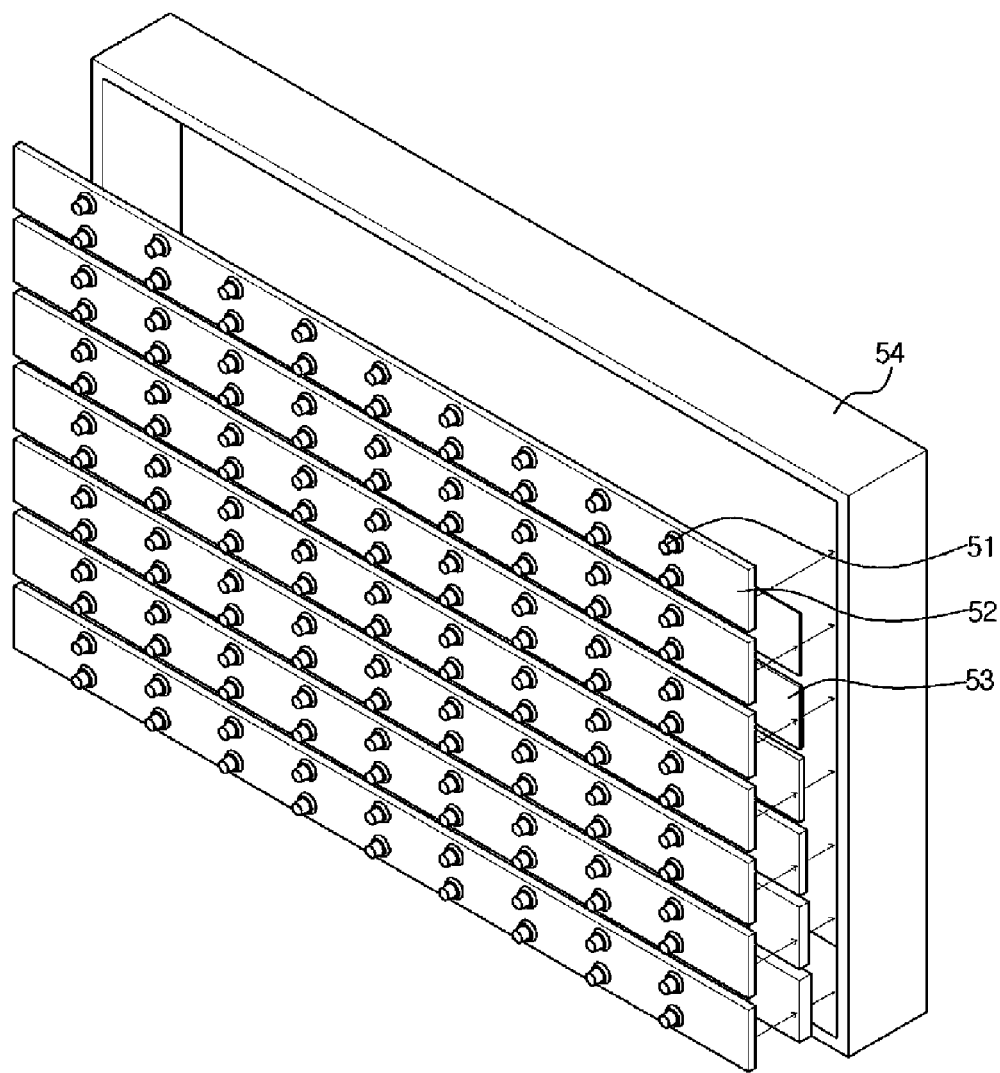
FIG. 2 is an exploded perspective view showing a top-down type backlight unit according to a first exemplary embodiment of the present invention.

FIG. 2 is an exploded perspective view showing a top-down type backlight unit according to a first exemplary embodiment of the present invention. As shown in FIG. 2, the light emitting diodes 51 are attached to the circuit board 51 prepared at the front surface of the frame 54 in such a manner that the light emitting diodes 51 are arranged in the form of two (upper and lower) lines on each circuit board 41. In this case, the light emitting diodes 51 are alternately arranged such that R, G, and B color light can be irradiated.

A number of the light emitting diodes 51 according to colors varies depending on an amount of color light emitted from the light emitting diodes 51.

When the light emitting diodes 51 emitting R, G, and B color light are alternately arranged on each line as described above, or when a light emitting diode emitting white light is provided, white light is irradiated from the backlight unit 50 (see FIG. 1) so that color images can be realized on the liquid crystal panel 10 (see FIG. 1). The backlight unit 50 may be formed of light emitting diodes also.

According to an exemplary embodiment of the present embodiment, the temperature adjusting members 53 are attached to rear portions of the circuit boards 52, except for the rear portion of an uppermost circuit board 52.

Figure 3:
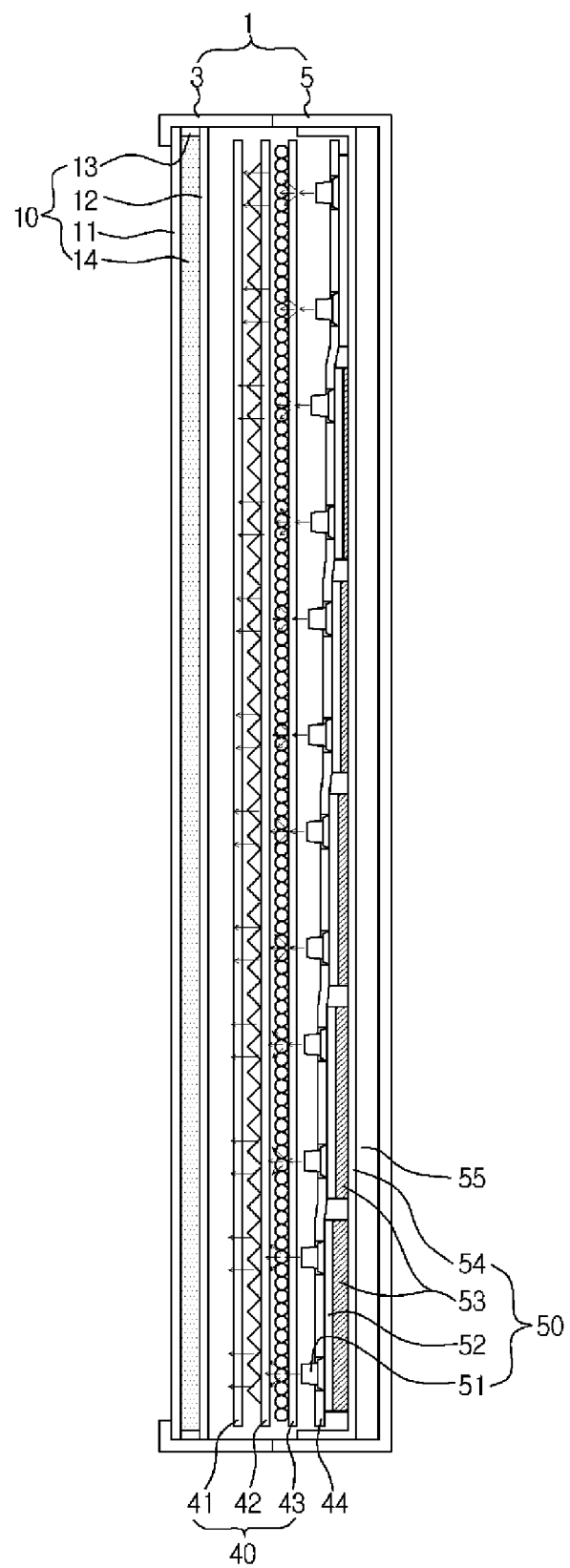
FIG. 3 is a side sectional view showing a liquid crystal display device according to FIGS. 1 and 2.

Hereinafter, details will be described with reference to FIG. 3 regarding components comprising an exemplary embodiment of the liquid crystal display device 1. FIG. 3 shows a side view of the first chassis 3 and second chassis 5 of FIGS. 1 and 2 in an unexploded position. The liquid crystal panel 10 includes a thin film transistor substrate 11 formed with thin film transistors, a color filter substrate 12 facing the thin film transistor 11, a sealant 13 used for bonding the thin film transistor substrate 11 to the color filter substrate 12, and a liquid crystal layer interposed between the two substrates 11 and 12 and the sealant 13.

A driver (not shown) applying a driving signal to the liquid crystal panel 10 is provided at a side surface of the liquid crystal panel 10. In addition, the driver may be installed at the thin film transistor substrate 11 or at a side surface of the liquid crystal panel 10.

The reflector plate 44 covers the circuit boards 54 so as to reflect the light irradiated from the light emitting diodes 51 toward the liquid crystal panel 10 without the light being scattered.

The diffusion plate 43 provided at the front portion of the reflector plate 44 includes a base plate and a coating layer having a plurality of balls formed on the base plate.

In order to address a problem occurring when the light irradiated from the light emitting diode 51 is directly incident on the liquid crystal panel 10, that is, prevent the exposure of the position and the irregularity of the brightness of the light emitting diode 51, the diffusion plate 43 uniformly diffuses the light irradiated from the light emitting diode 51 so as to provide the light to the liquid crystal panel 10.

In addition, the prism sheet 42 is provided at a front surface of the diffusion plate with triangular micro-prisms having an alignment so as to condense the light diffused by the diffusion plate 43 in a perpendicular direction to the liquid crystal panel 10. The prism sheet 42 may be a prism film. The alignment of the triangular micro-prisms may be predetermined. The light having passed through the prism sheet 42 mostly travels in a horizontal direction so as to give uniform brightness distribution.

Moreover, two prism sheets 42 may be used, and the micro-prisms may be provided on two prism sheets 42 at an angle. The angle may be predetermined.

The protect sheet 41 arranged at a front surface of the prism sheet 42 protects the prism sheet 42 which can be easily scratched.

Meanwhile, regarding the arrangement state of the circuit boards 52 and the temperature adjusting members 53 attached to the front surface of the frame 54, the circuit boards 52 and the temperature adjusting members 53 are arranged from the upper portion to the lower portion of the front surface of the frame 54 at an interval, and the uppermost circuit board 52 attached to the uppermost portion of the frame 54 has no the temperature adjusting member 53 at the rear portion thereof. The interval of the circuit boards 52 and the temperature adjusting members may be predetermined.

The temperature adjusting members 53 are attached to the circuit boards 52 from the second uppermost circuit board, except for the first uppermost circuit board. As shown in FIG. 3, a thickness of the temperature adjusting members becomes increased from the upper temperature adjusting member to the lower temperature adjusting member. Therefore, the heat resistance of the temperature adjusting member 53 increases downward so that the heat, which is emitted from the light emitting diodes 51 provided at the lower portion of the frame 54, is prevented from being transferred to the rear portion of the temperature adjusting member 53.

According to the temperature distribution formed by heat emitted from the light emitting diodes 51, since the temperature is highest at an uppermost portion and is lowest at a lowermost portion, it is advantageous if heat is rapidly transferred to the frame 54 at the uppermost portion, and is prevented from being transferred to the frame 54 at the lowermost portion of the liquid crystal display device 1 in order to prevent an excessive temperature difference from occurring between the upper portion and the lower portion.

It is advantageous that the temperature distribution be uniform across the upper and lower portions as described above because an optical power characteristic of the light emitting diodes 51 is excessively changed according to temperature variation.

Figure 4A:
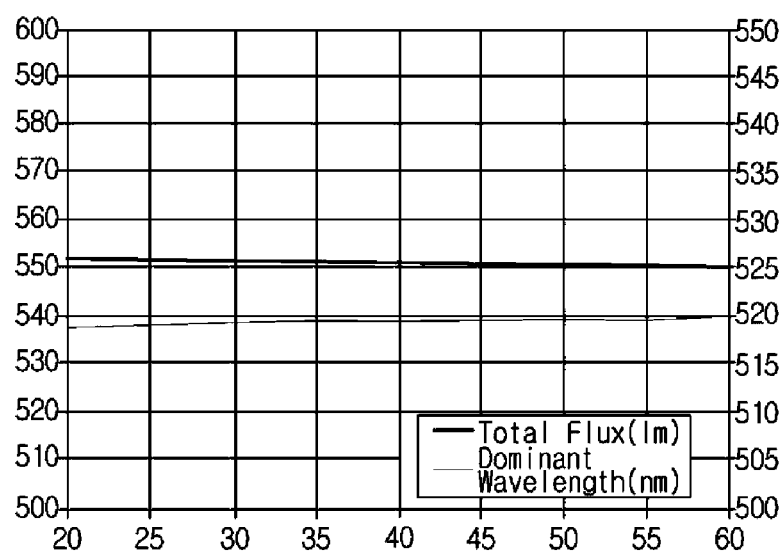
FIGS. 4A to 4C are graphs showing a change of an optical power of G, B, and R color light, respectively, as a function of a change in temperature.
Figure 4B:
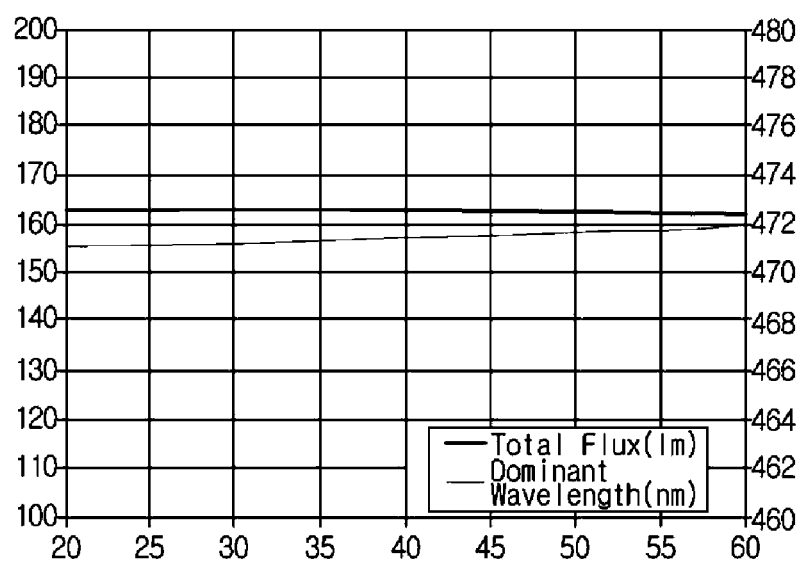
Figure 4C:
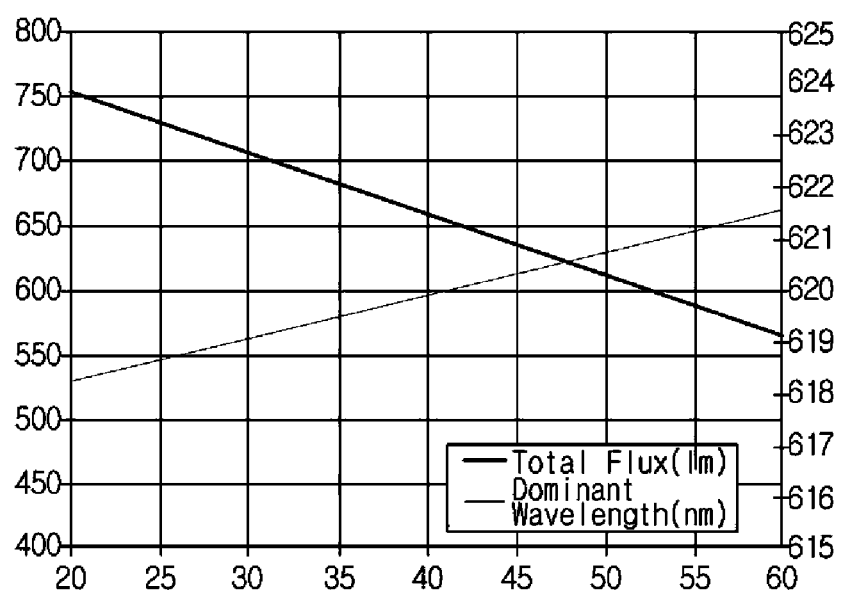

FIGS. 4A to 4C illustrate optical power characteristics of G, B, and R light emitting diodes according to a variation in temperature. According to the optical power characteristics of the light emitting diodes irradiating G, B, and R color light, as shown in FIGS. 4A to 4C, respectively, the optical power is not excessively changed in the G and B color light (see FIGS. 4A and 4B, respectively). However, since the brightness of the R color light (see FIG. 4C) is excessively changed according to a variation in temperature, a brightness difference between the light emitting diodes irradiating the R color light, which are positioned in high-temperature and low-temperature parts, is great so that stain seems to be formed on an image. Accordingly, it is advantageous if the temperature distribution is uniform across the liquid crystal display panel.

In addition, if a temperature difference between the upper and lower portions is excessive, a life span of the light emitting diodes positioned in the high-temperature part is relatively reduced as compared with a life span of the light emitting diodes positioned in the low-temperature part.

If a life span of a light emitting diode which is positioned in the upper portion is ended after a predetermined time interval, but a life span of the light emitting diode which is positioned in the lower portion remains, the image state of the liquid crystal display device becomes unstable.

Accordingly, in order to allow the light emitting diodes to have a similar life span, it is advantageous that the temperature distribution be uniform in the upper and lower portions.

The temperature adjusting members 53 shown in FIG. 3 each includes polystyrene resin or polyurethane resin capable of maintaining an amount of heat. The amount of heat may be predetermined. As a thickness of the resin becomes thicker, a heat resistance of the resin increases, and the heat transfer rates of the resin are lowered.

Accordingly, if a temperature adjusting member having higher heat resistance is attached to the rear portion of the circuit board 52 mounted on the lower portion of the frame 54, the heat emitted from the light emitting diodes 51 of the circuit board 52 is less easily transferred to the rear portion of the circuit board 52 as compared with that of the light emitting diodes 51 positioned in the upper portion of the frame 54. Therefore, the temperature is raised in the lower portion of the frame 54, thereby compensating for the temperature difference between the upper and lower portions. As a result, the temperature distribution can be made more uniform across the entire liquid crystal display device.

In addition to making a difference in a thermal resistivity of the temperature adjusting members, which are formed of a same material, by adjusting the thickness of the temperature adjusting members, according to the temperature distribution, members having different thermal conductivity may be positioned according to temperatures such that different thermal resistivity is employed according to the temperature. This is because the heat resistance is proportional to a thickness of the temperature adjusting member, and inversely proportional to a thermal conductivity.

In other words, the temperature is measured so that materials, such as a thermal pad, having higher thermal conductivity may be inserted in a high-temperature part, and materials, such as polystyrene resin or polyurethane resin, having lower thermal conductivity may be arranged in a low-temperature part.

Figure 5:
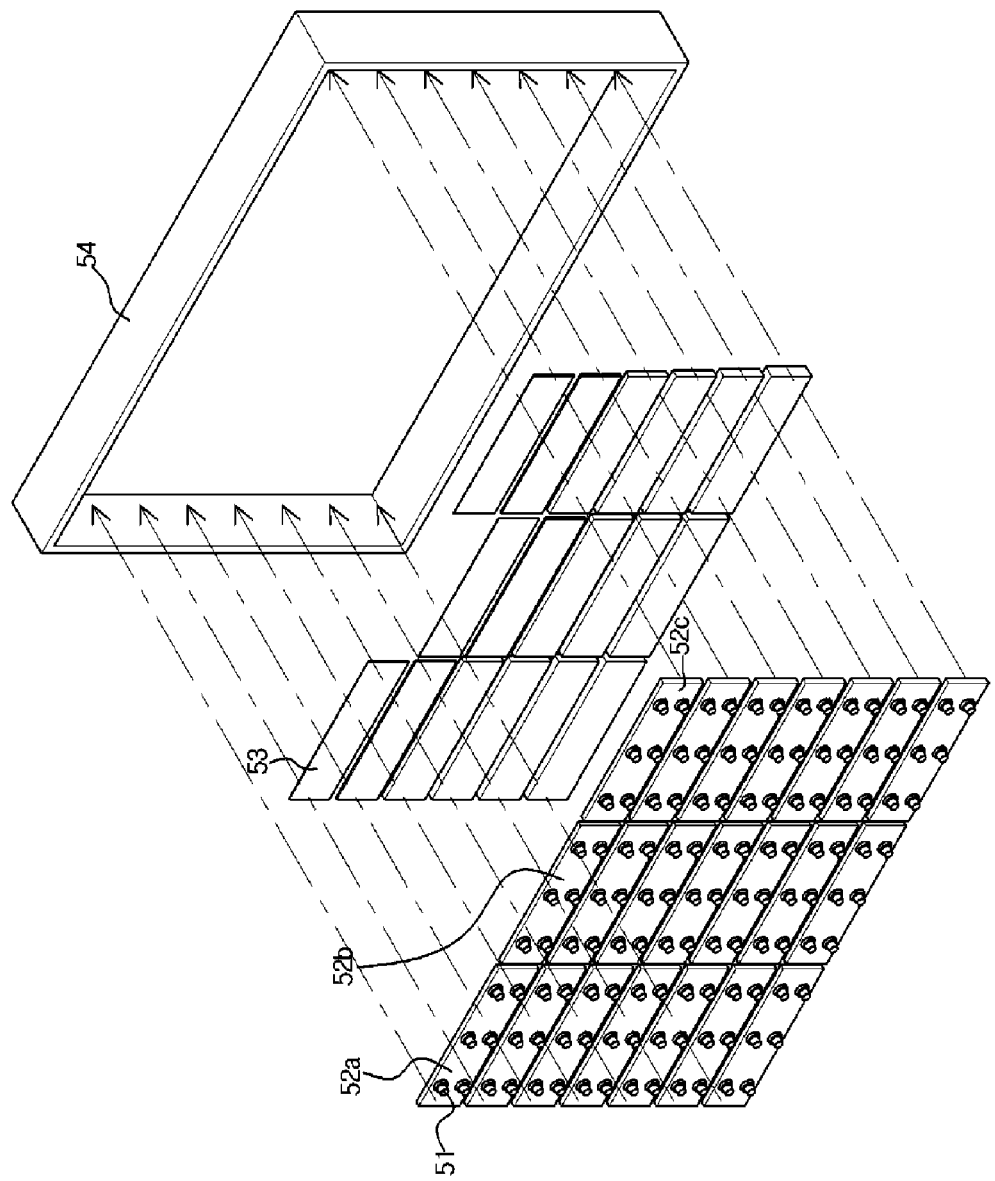
FIG. 5 is an exploded perspective view showing a top-down type backlight unit according to a second exemplary embodiment of the present invention.

FIG. 5 is an exploded perspective view showing a top-down type backlight unit according to a second exemplary embodiment of the present invention. Although it has been described in the first exemplary embodiment that the circuit boards 52 and the temperature adjusting members 53 are formed in a transverse direction, according to the second exemplary embodiment of the present invention shown in FIG. 5, the circuit boards 52 and the temperature adjusting members 53 are also divided in a longitudinal direction. For example, as shown in FIG. 5, an uppermost line of the circuit boards may be divided longitudinally into three circuit boards 52a, 52b, and 52c. The light emitting diodes 51 and frame 54 are the same as in the earlier exemplary embodiment.

The temperature adjusting members 52 are divided in transverse and longitudinal directions as described above in order to remove a temperature difference between both sides and a center of the backlight unit because a temperature difference may also exist between both sides and the center as well as the upper portion and the lower portion of the display device.

Accordingly, the temperature adjusting members 52 have different thicknesses such that a temperature adjusting member 52 mounted in the center of the display panel has a heat resistance different from that of a temperature adjusting member 52 mounted at both sides of the display panel.

Figure 6A:
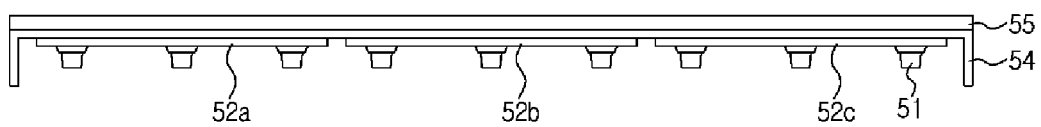
FIGS. 6A to 6C are plan sectional views showing a backlight unit according to the second exemplary embodiment of the present invention.
Figure 6B:
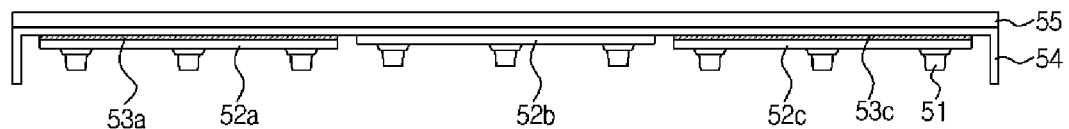
Figure 6C:
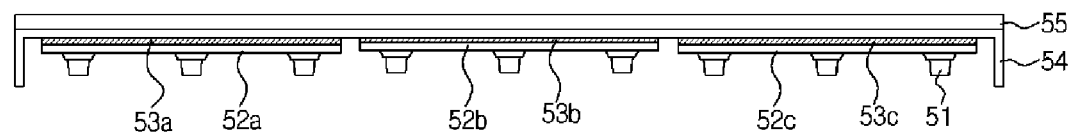

FIGS. 6A to 6C show top view of a first uppermost portion, a second uppermost portion, and a third uppermost portion, respectively, of the circuit boards and temperature adjusting members of FIG. 5. As shown in FIG. 6A, the first uppermost portion of circuit boards 52a, 52b, and 52c mounted on the uppermost portion of the frame 54 are directly attached to the front surface of the frame 54 without corresponding temperature adjusting members 53.

This is because heated air ascends so that hot air is collected in the uppermost portion of the frame 54. Therefore, the uppermost portion of the frame 54 has the highest temperature. Accordingly, heat is directly transferred to the frame 54 and the heat emitting member 55 through the circuit board 52 such that the heat can be instantaneously dissipated.

As shown in FIG. 6B, in the second uppermost portion, temperature adjusting members 53a and 53c are mounted only on the circuit boards 52a and 52c installed at both sides of the frame 54 but not on the circuit board 52b installed at the center portion of the frame 54. This is because the temperature is slightly lower at both sides of the frame 54 than at a center of the second uppermost portion of the frame 54, which is approximately equal to the temperature in the first uppermost portion of the frame 54. Accordingly, in order to compensate for the temperature at both sides of the frame 54, the temperature adjusting members 53a and 53c having slightly lower heat resistance are attached to the circuit boards 52a and 52c at either side of the frame 54.

As shown in FIG. 6C, the temperature adjusting members 53a, 53b, and 53c are installed at the rear portion of the circuit boards 52 mounted on a third uppermost portion and the lower portions. In this case, the thickness of the temperature adjusting members 53a and 53c at the sides of the frame 54 is thicker as compared with that of the temperature adjusting member 53b at a center of the frame 54. This compensates for the temperature difference between the both sides and the center portion of the frame 54.

In addition, the thickness of the temperature adjusting members 53 becomes thicker in the downward direction thereof, as shown in FIG. 5, so that the thermal resistivity gradually increases. Accordingly, the temperature difference is reduced among the upper portion, the lower portion, the center portion, and both sides of the frame 54.

Meanwhile, differently from the liquid crystal display device including the top-down type backlight unit, the characteristic of a liquid crystal display device including an edge-light type backlight unit will be described below.

The same reference numerals will be assigned to the components which are the same as those according to the earlier-described exemplary embodiments, and detailed description thereof will be omitted in order to avoid redundancy.

Figure 7:
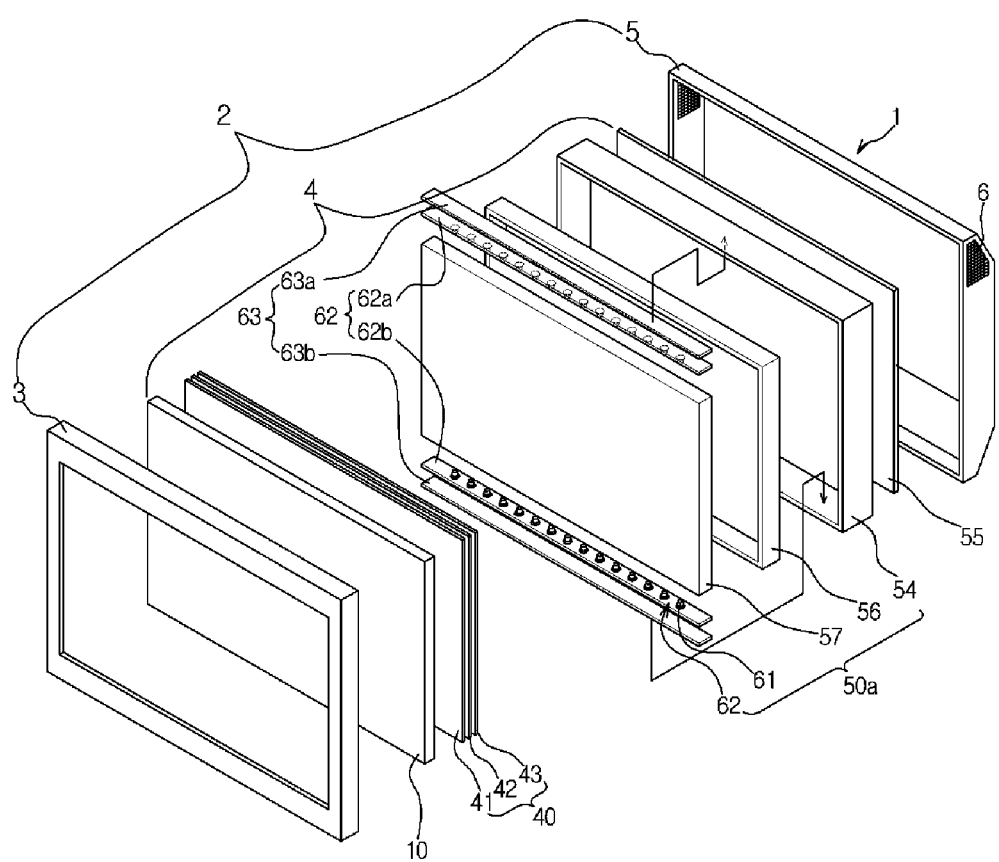
FIG. 7 is an exploded perspective view showing a liquid crystal display device including an edge-light type backlight unit according to another exemplary embodiment of the present invention.

As shown in FIG. 7, a liquid crystal display device 1 comprises a chassis 2 forming an external appearance of the liquid crystal display device 1. The chassis 2 includes a first chassis 3 and a second chassis 5, and a liquid crystal panel 10 is provided at the rear portion of the first chassis 3, and the protect sheet 41, the prism sheet 42, and the diffusion plate 43 comprising the light transfer unit 40 are arranged at the rear portion of the liquid crystal panel 10, similarly to those of the earlier-described exemplary embodiments.

A light guiding plate 57 is provided at the rear portion of the light transfer member 40 to guide light, light emitting diodes 61 are installed at upper and lower portions of the light guide plate 57 to irradiate light toward the light guide plate 57, and the light emitting diodes 61 are mounted on circuit boards 62 provided at the upper and lower portions of the light guide plate 57, respectively.

The circuit boards 62 include a first circuit board 62a provided at the upper portion of the light guide plate 57 and a second circuit board 62b provided at the lower portion of the light guide plate 57.

Although the circuit boards 62 and the light emitting diodes 61 are shown at the upper and lower portions of the light guide plate 57, as shown in FIG. 7, the circuit boards 62 and the light emitting diodes 61 may alternatively be installed at both sides of the light guide plate 57.

The light emitting diodes 61 mounted on the first circuit board 62a face the light emitting diodes 61 mounted on the second circuit board 62b at both sides of the light guide plate 57.

Further, in a case where a portion of light generated from the light emitting diodes 61 and then incident on the light guide plate 57 is transmitted to the rear portion of the light guide plate 57, a reflector plate 56 is provided at the rear portion of the light guide plate 57 so as to reflect the light, which has been transmitted to the rear portion of the light guide plate 57, toward the liquid crystal panel 10.

A frame 54 is provided at the rear portion of the reflector plate 56 so as to fix the circuit boards 62 thereto, and temperature adjusting members 63 having a pad shape are inserted between the frame 54 and the circuit boards 62.

In this case, the temperature adjusting members 63 are arranged in order to prevent an excessive internal temperature difference from occurring in the upper and lower portions due to heat generated from the light emitting diodes 61 attached to the first and second circuit boards 63a and 63b in a similar manner to those of the earlier-described exemplary embodiments.

Therefore, the temperature adjusting members 63 are provided as first and second temperature adjusting members 63a and 63b corresponding to the first and second circuit boards 63a and 63b. The first temperature adjusting member 63a is attached to the inner upper portion of the frame 54, and the second temperature adjusting member 63b is attached to the inner lower portion of the frame 54.

The circuit boards 62, the temperature adjusting members 63, and the reflector plate 56 attached to the frame 54 form the backlight unit 50a.

The heat emitting member 55 is arranged at the rear portion of the frame 54 so as to discharge heat, which has been transmitted to the frame 54, to an exterior, and the heat discharged to the exterior by the heat emitting member 55 is discharged to the outside of the chassis 2 through the air holes 6 provided at both sides of the second chassis 5.

Figure 8:
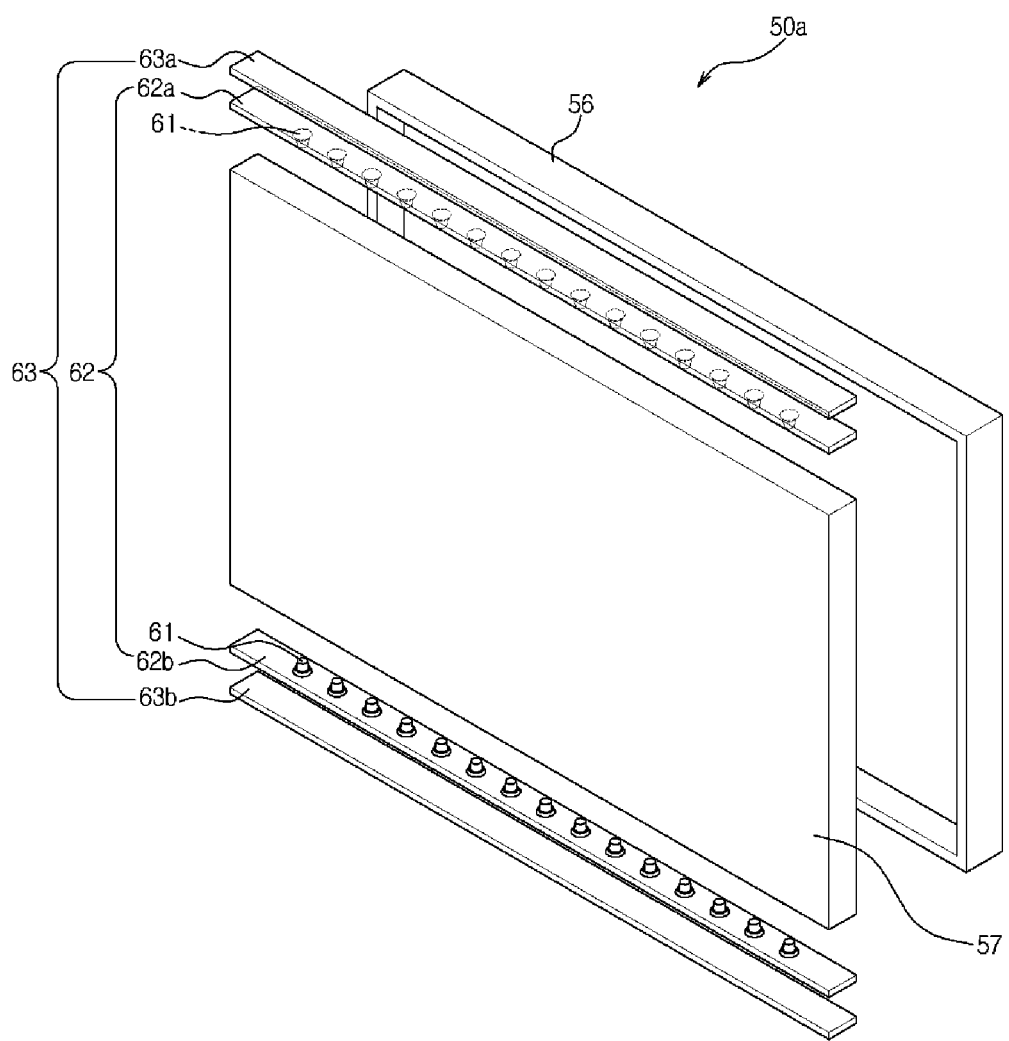
FIG. 8 is an exploded perspective view showing a backlight unit according to a third exemplary embodiment of the present invention.
Figure 9:
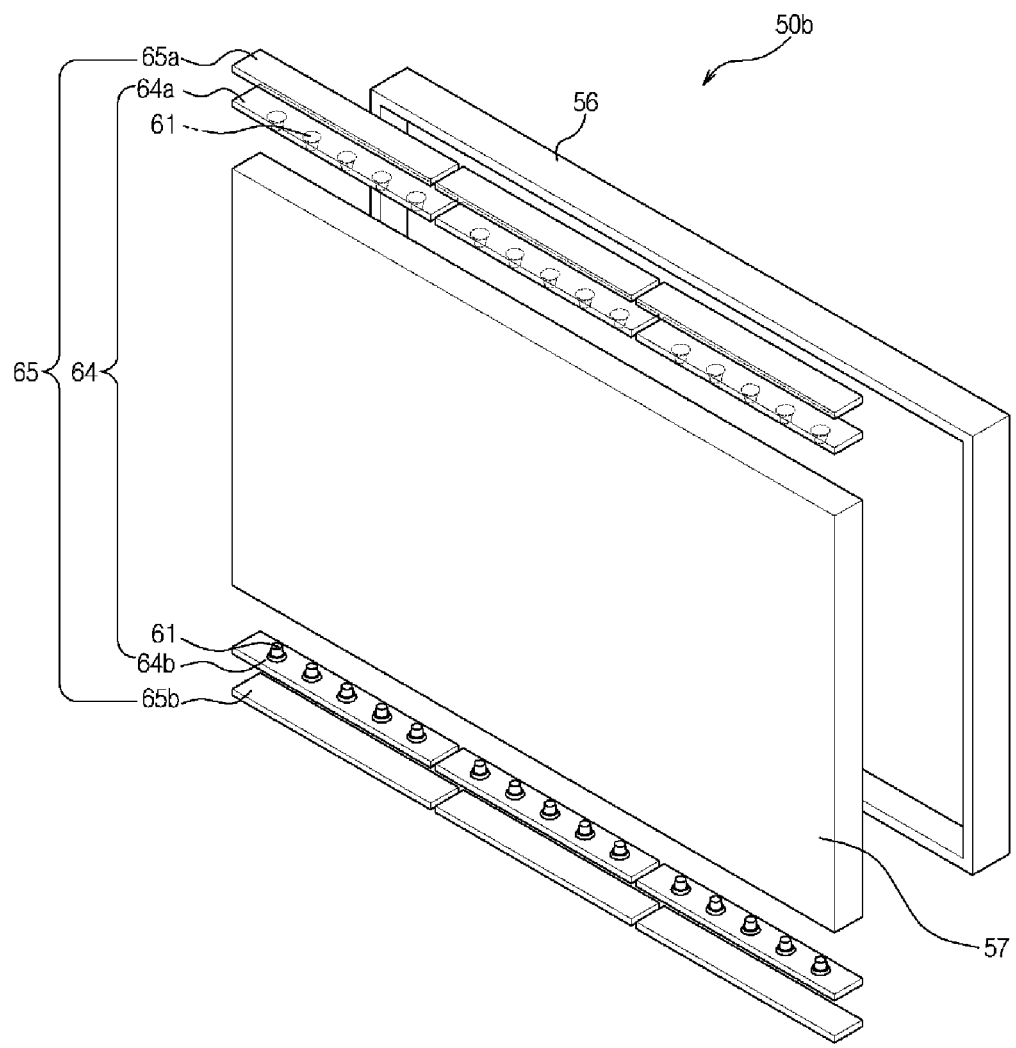
FIG. 9 is an exploded perspective view showing a backlight unit according to a fourth exemplary embodiment of the present invention.

FIG. 8 is an exploded perspective view showing a backlight unit 50a having the circuit boards 62 and the temperature adjusting members 63 provided in the longitudinal direction of the light guide plate 57 according to a third exemplary embodiment of the present invention. FIG. 9 is an exploded perspective view showing a backlight unit having divided circuit boards 64 and divided temperature adjusting members 65 arranged at the upper and lower portions of the light guide plate 57 according to a fourth exemplary embodiment of the present invention.

Figure 10:
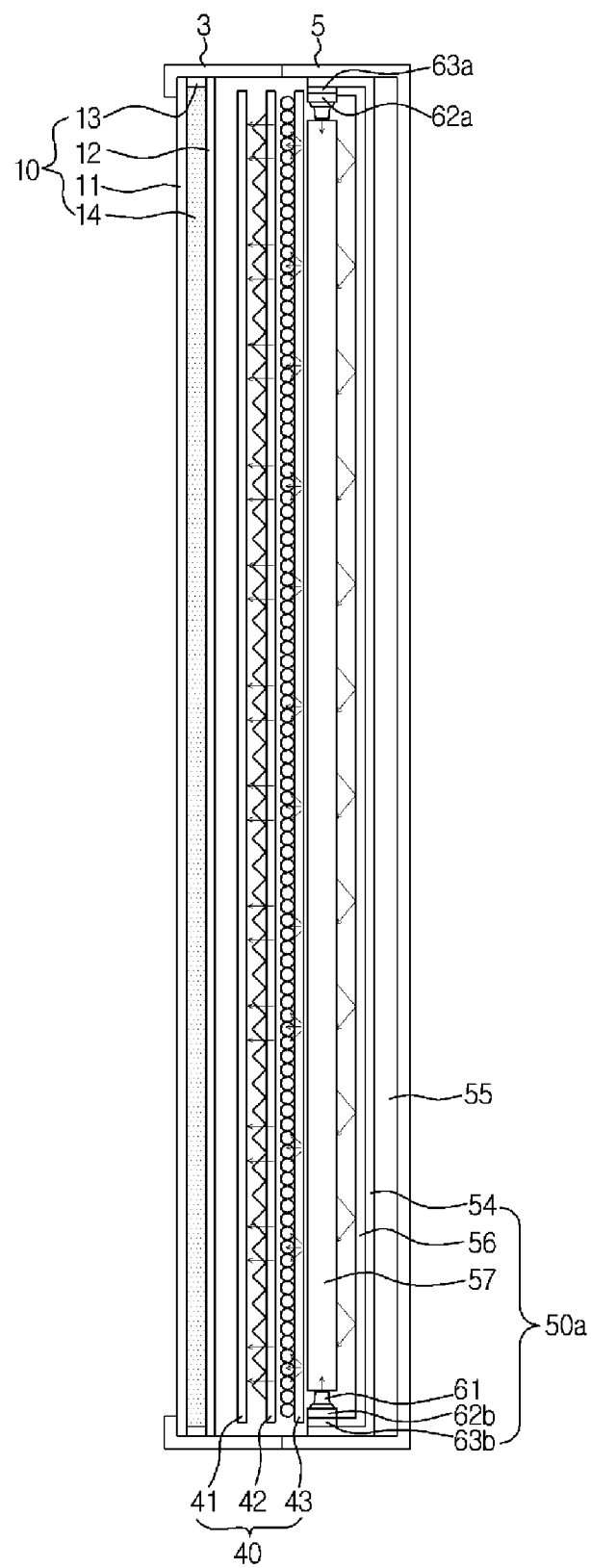
FIG. 10 is a side sectional view showing a liquid crystal display device including an edge-light backlight unit according to the third exemplary embodiment of the present invention.

FIG. 10 is a side sectional view showing a liquid crystal display device according to the third embodiment of the present invention. As described above, the first temperature adjusting member 63a and the second temperature adjusting member 63b are attached to the upper inner side wall and the lower inner side wall of the frame 54 as described above. In this case, if the first temperature adjusting member 63a is formed of the same material as that of the second temperature adjusting member 63b, it is advantageous if the thickness of the first temperature adjusting member 63b is thinner than the thickness of the second temperature adjusting member 63b.

If the first temperature adjusting member 63a has a material different from that of the second temperature adjusting member 63b, it is advantageous if a heat transfer rate of the first temperature adjusting member 63b is higher than a heat transfer rate of the second temperature adjusting member 63b. In other words, it is advantageous if a thermal resistivity of the first temperature adjusting member 63a is lower than a thermal resistivity of the second temperature adjusting member 63.

If the liquid crystal display device operates such that the light emitting diodes 61 emit light, heat is emitted from the light emitting diodes 61, and the temperature is raised in the vicinity of the light emitting diode 61 due to the heat.

The temperature in the vicinity of the first circuit board 62a is raised more as compared with the temperature in the vicinity of the second circuit board 62b by a convection current phenomenon in which high-temperature air rises and low-temperature air descends, thereby creating a temperature difference in the vicinities of the first and second circuit boards 62a and 62b. Accordingly, the light emitting diodes 61 mounted on the first circuit board 62a have a life span and a light emitting characteristic different from a life span and a light emitting characteristic of the light emitting diodes 61 mounted on the second circuit board 62b, so that the image state of the liquid crystal display device is deteriorated.

Therefore, the first temperature adjusting member 63a having a higher heat transfer rate (lower thermal resistivity) is used for the first circuit board 62a such that heat is more smoothly discharged to an exterior, and the second temperature adjusting member 63b having a lower heat transfer rate (higher thermal resistivity) is used for the second circuit board 62b such that heat remains, thereby minimizing the temperature difference in the upper portion and lower portion. Accordingly, the life span and the performance of the light emitting diodes 61 can be uniformed.

Figure 11:
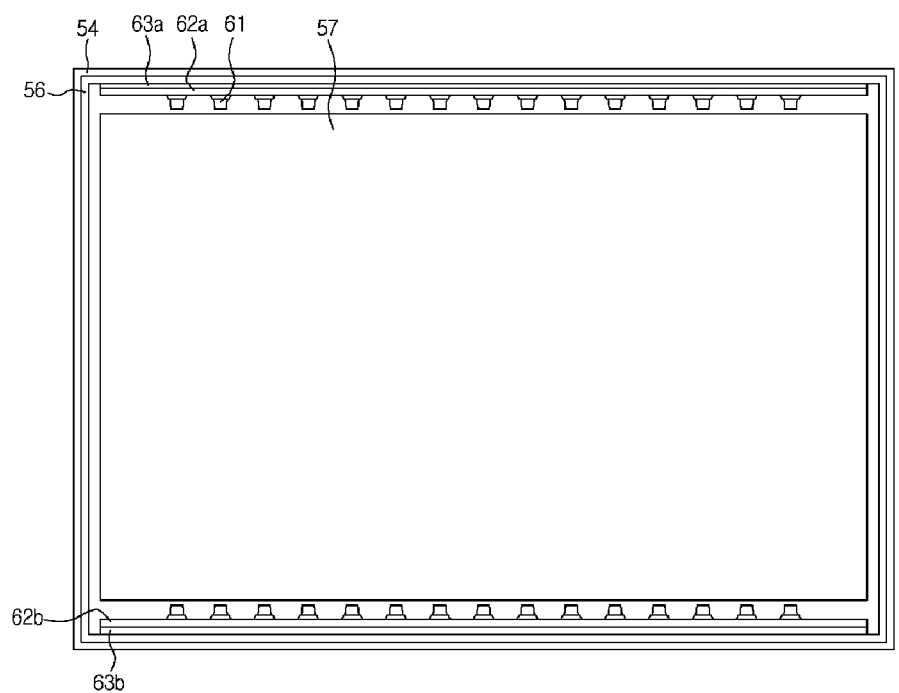
FIG. 11 is a front view showing a backlight unit according to the third exemplary embodiment of the present invention.

Accordingly, it can be recognized from FIG. 11 that the thickness of the first temperature adjusting member 63a is thinner than the thickness of the second temperature adjusting member 63b. In addition, according to the third exemplary embodiment, the first and second temperature adjusting members 63a and 63b have uniform thickness.

Figure 12:
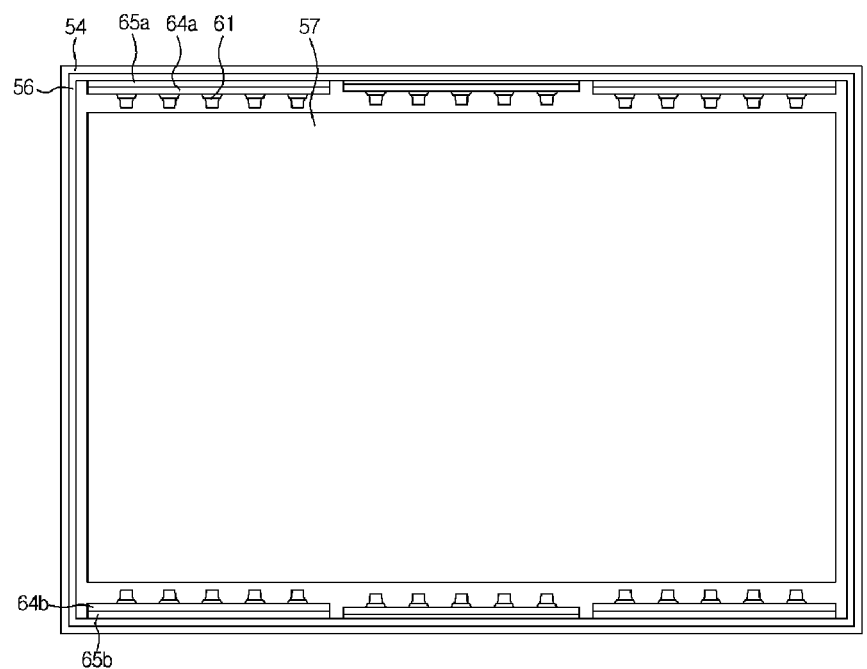
FIG. 12 is a front view showing a backlight unit according to the fourth exemplary embodiment of the present invention.

FIG. 12 shows a first circuit board 64a and a second circuit board 64b divided into three sections, and a first temperature adjusting member 65a and a second temperature adjusting member 65b divided into three sections corresponding to the first circuit board 64a and the second circuit board 64b.

Since a temperature of the center portion of each circuit board is relatively higher than a temperature in the peripheral portion of the circuit board, the circuit boards 64a and 64b and the temperature adjusting members 65a and 65b are divided into three portions in order to more quickly discharge heat in the center portion of the circuit board than in the peripheral portions of the circuit board, thereby reducing the temperature difference between the center portion and the peripheral portions of the circuit board.

Accordingly, among the first and second temperature adjusting members 65a and 65b, the temperature adjusting member, which is arranged in the center portion of each circuit board, having a thinner thickness or a higher heat transfer rate than the temperature adjusting members at the sides is used, thereby preventing the temperature difference between the center portion and the peripheral potions of the circuit board from excessively being large.

Hereinafter, an operational procedure of uniformly distributing an internal temperature of the liquid crystal display device according to an exemplary embodiment of the present invention will be described with accompanying drawings.

As shown in FIG. 3, the liquid crystal display device having the top-down type backlight unit allows light irradiated from the light emitting diode 51 be incident on the liquid crystal panel 10 through the light transfer unit 40, thereby realizing a color image on the liquid crystal panel 10. Such an operation is continuously performed for a time interval, and heat is emitted from the light emitting diode 51. The time interval may be predetermined.

A portion of heat generated from the light emitting diode 51 is transferred to the frame 54 and the heat emitting member 55 through circuit board 52 so that the portion of the heat is dissipated. The remaining portion of the heat is circulated in the vicinity of the light emitting diode 51 so that warm air moves to the upper portion, and cold air moves to the lower portion.

Meanwhile, the heat of the light emitting diode 51 and the circuit board 52 positioned at the upper portion of the frame 54 is smoothly discharged to an exterior through the frame 54 and the heat emitting member 55.

However, since the thickness of the temperature adjusting member 53 becomes gradually thicker from the upper portion to the lower portion of the frame 54, an amount of heat transferred to the frame 54 from the light emitting diode 51 and the circuit board 52 is reduced.

In other words, the temperature adjusting member 53 is used as a kind of a thermal insulator, thereby compensating for the temperature difference in the vicinities of the light emitting diodes 51 mounted on the upper portion, the middle portion, and the lower portion of the frame 54.

Figure 13A:
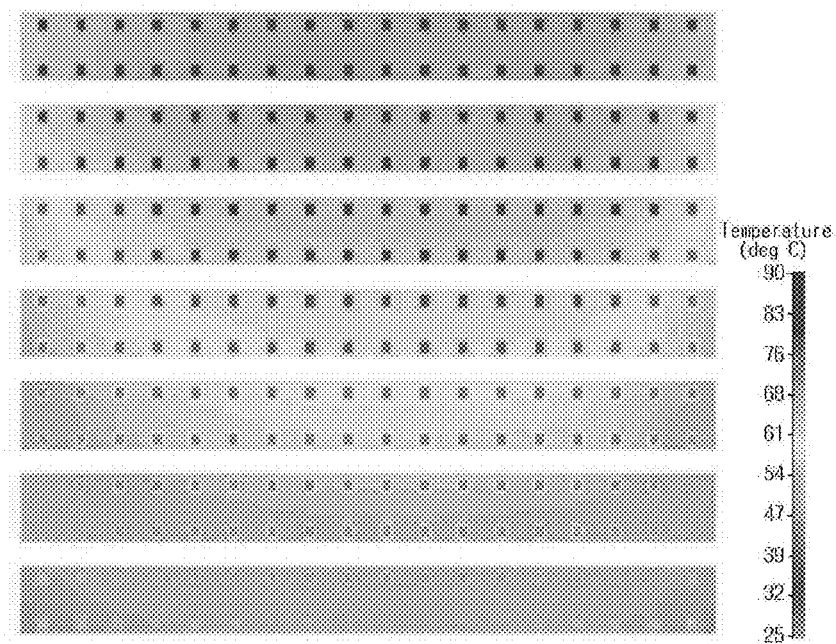
FIG. 13A is a graph showing the temperature distribution of a related art top-down type backlight unit.

When comparing a temperature distribution according to the related art techniques and a temperature distribution according to exemplary embodiments of the present invention, it can be recognized from FIG. 13A illustrating a temperature distribution according to a related art technique that a high temperature part, which is marked with orange-based colors, is formed the upper portion of a graph shown in FIG. 13A, a low temperature part, which is marked with green or blue-based colors, is formed at the lower portion of the graph, and the temperature difference between the highest-temperature part and the lowest-temperature part is about 22° C.

Figure 13B:
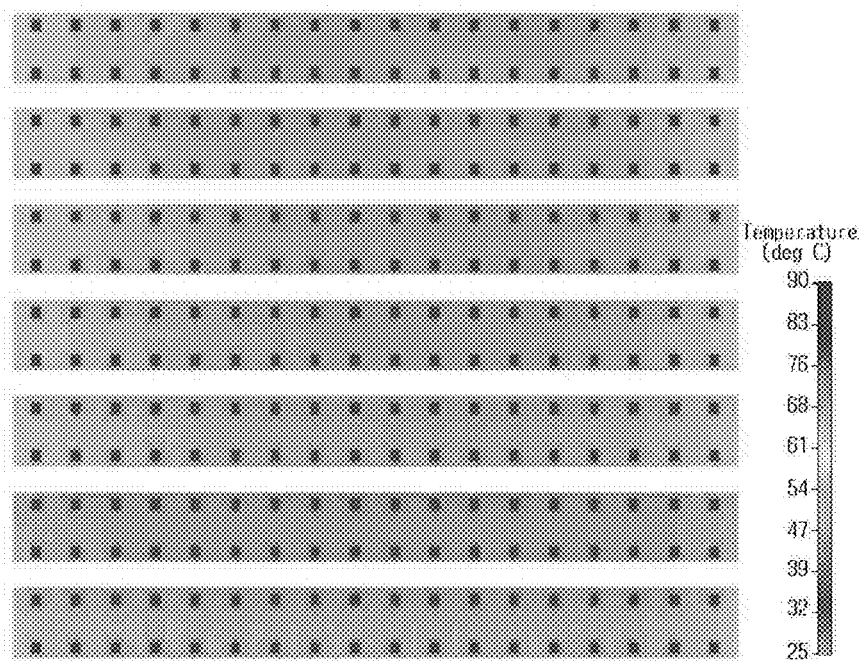
FIG. 13B is a graph showing the temperature distribution of a top-down type backlight unit according to the first exemplary embodiment of the present invention.

Referring to FIG. 13B showing a temperature distribution according to the first exemplary embodiment of the present invention, orange-based color is exhibited over the whole area of all light emitting diodes and circuit boards, and yellow-based color is exhibited at a part of the boundary portion. In other words, the temperature difference among the upper part, the middle part and the lower part is significantly reduced. As shown in FIG. 13B, the temperature difference between the highest-temperature part and the lowest-temperature part is reduced to about 6° C., so that temperature compensation of about 16° C. can be obtained as compared with the related art.

Figure 13C:
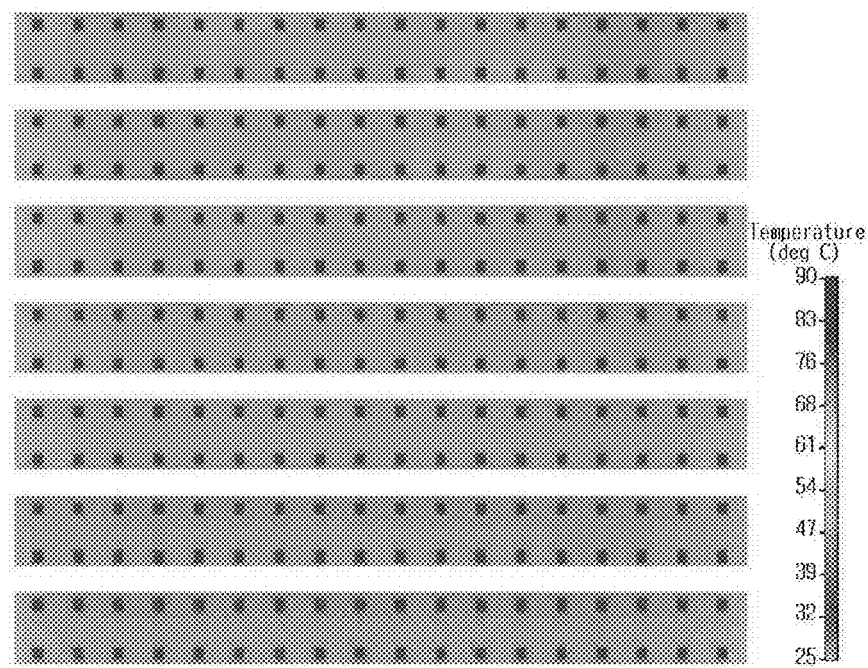
FIG. 13C is a graph showing the temperature distribution of a top-down type backlight unit according to the second exemplary embodiment of the present invention.

Meanwhile, FIG. 13C shows temperature distribution according to the second exemplary embodiment of the present invention. According to the second embodiment of the present invention, the temperature difference between the center portion and the side portion of the frame can be compensated. Referring to the temperature distribution show in FIG. 13C, the boundary portion exhibits the orange-based color, which means that the temperature difference between the highest-temperature part and the lowest-temperature part is significantly reduced. According to the temperature distribution in FIG. 13C, the temperature difference between the highest-temperature part and the lowest-temperature part is about 3° C.

In addition, according to an exemplary embodiment of the present invention, the heat emitting member 55 installed at the rear portion of the frame 54 (see, FIG. 1) so as to emit heat may include a heat pipe, a blowing fan, or a heat sink having fins. Alternatively, the frame 54 may serve as a heat emitting member without using the heat emitting member 55.

According to the first exemplary embodiment of the present invention, the temperature adjusting members 53 are not attached to the rear portion of the circuit board 52 (see FIG. 1) installed at the uppermost portion of the front of the frame 54, but attached to the remaining circuit board 52. However, the temperature adjusting member 53 can also be attached to the rear portion of the circuit board 52 installed at the uppermost portion of the front of the frame 54.

Meanwhile, in the case of the liquid crystal display device having the edge-light type backlight unit, as shown in FIG. 10, the light emitted from the light emitting diode 61 is incident into the light guide plate 57, and then a part of the light incident into the light guide plate 57 sequentially passes through the light transfer unit 40 and the liquid crystal panel 10.

In addition, a part of light moves toward the reflector plate 56 and then is reflected from the reflector plate 56, so that the part of light is again incident into the light guide plate 57 and then is incident into the liquid crystal panel 10 through the light transfer unit 40.

The light emitting diodes 61 attached to the first and second circuit boards 62a and 62b emit light while generating heat. This heat is emitted to the exterior by way of the first and second circuit boards 62a and 62b, the first and second temperature adjusting members 63a and 63b, the frame 54, and the heat emitting member 54.

As mentioned above, even if the upper and lower light emitting diodes 61 generate the same amount of heat, high-temperature air is moved toward the upper light emitting diode 61 due to a convention phenomenon. Since there is a difference in thermal transfer coefficient between the first and second temperature adjusting members 63a and 63b, a great amount of heat may be rapidly emitted in the region where the first temperature adjusting member 63a is positioned as compared with the region where the second temperature adjusting member 63b is positioned. Thus, the temperature can be uniformly maintained between the upper and lower light emitting diodes 61.

Hereinafter, the temperature distribution according to exemplary embodiments of the present invention will be compared with the temperature distribution according to the related art.

Figure 14A:
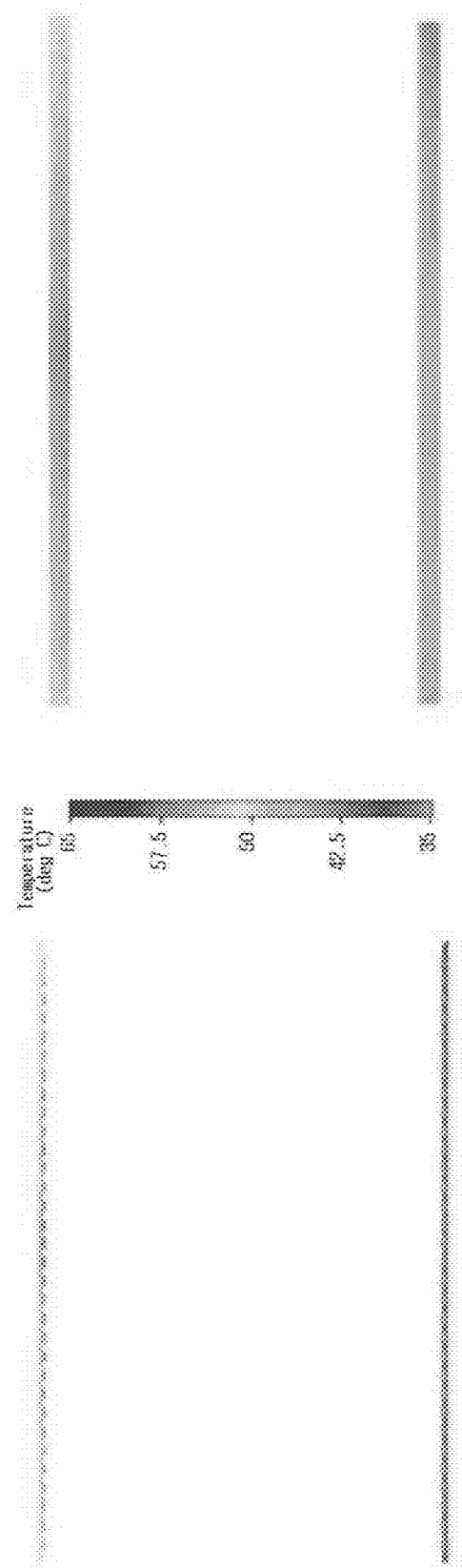
FIG. 14A is a graph showing the temperature distribution of a related art edge-light type backlight unit.

As shown in FIG. 14A, according to the temperature distribution in the liquid crystal display device including the related art edge-light type backlight unit, the temperature in the upper portion of the liquid crystal display device is greatly different from the temperature in the lower portion of the liquid crystal display device.

That is, on the basis of the temperature spectrum shown in FIG. 14A, the left part represents the side portions of the first and second circuit boards 62a and 62b and the light emitting diode 61, and the right part represent the top surfaces of the first and second circuit boards 62a and 62b and the light emitting diode 61. The upper portion exhibits yellow and red colors, which represents the temperature distribution in the range of about 50° C. to about 55° C.

However, the lower portion exhibits bright blue color, which represents the temperature distribution in the range of about 40° C. to about 45° C. Thus, there is the temperature difference of about 10° C. between the upper portion and the lower portion.

Figure 14B:
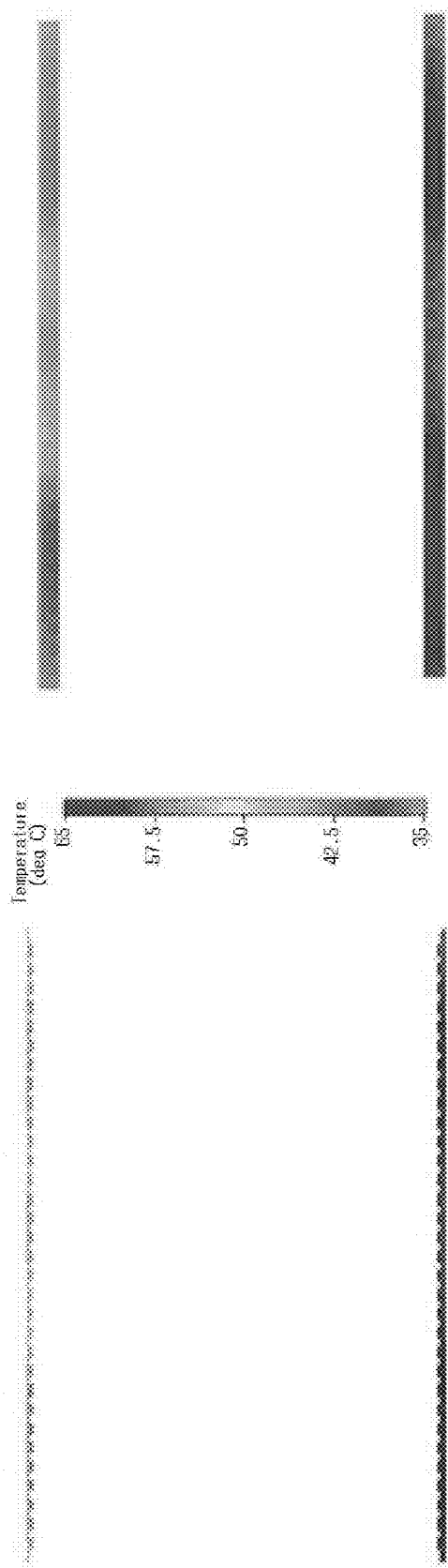
FIG. 14B is a graph showing the temperature distribution of an edge-light type backlight unit according to the third exemplary embodiment of the present invention.

However, in the case of an exemplary embodiment of the present invention, as shown in FIG. 14B, since the temperature adjusting members having different thermal transfer coefficients are attached to the upper and lower portions, respectively, red and yellow colors are exhibited over the whole area of the upper and lower portions, which means that the temperature difference is substantially removed between the upper and lower portions.

Accordingly, since the upper and lower light emitting diodes are exposed to the substantially same temperature, the light emitting performance and life span of the light emitting diodes can be uniformly maintained regardless of the installation position thereof.

As described above, according to exemplary embodiments of the present invention, the temperatures formed in the vicinities of the light emitting diodes installed in the liquid crystal display device are uniformly distributed in the liquid crystal display device, thereby preventing the brightness difference of light caused by the temperature difference from occurring. Accordingly, uniform color density and brightness can be realized over the entire panel.

In addition, the difference in the life spans of the light emitting diodes caused by the temperature difference does not occur, so that the light emitting diodes can have the same life span.

Although exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A liquid crystal display device comprising:
a plurality of circuit boards which are provided with light emitting diodes;
a frame on which the plurality of circuit boards are installed; and
a plurality of temperature adjusting members provided between the plurality of circuit boards and the frame, wherein the plurality of temperature adjusting members having different heat resistances are arranged according to a temperature distribution of heat emitted from the light emitting diodes such that a uniform temperature distribution is maintained across the liquid crystal display device.

2. The liquid crystal display device as claimed in claim 1, wherein the plurality of temperature adjusting members are provided and attached to a surface of the frame such that the temperature adjusting members are spaced apart from each other by a distance, and the plurality of temperature adjusting members are arranged such that a heat resistance of the plurality of temperature adjusting members increases from a high-temperature part to a low temperature part in a region where the light emitting diodes are provided.

3. The liquid crystal display device as claimed in claim 2, wherein each of the plurality of temperature adjusting members is provided in a form of a pad having an elongated shape, and a thickness of the pads of the plurality of temperature adjusting members becomes thicker from the high-temperature part to the low-temperature part in the region where the light emitting diodes are provided.

4. The liquid crystal display device as claimed in claim 3, wherein each of the plurality of temperature adjusting members includes an insulating material.

5. The liquid crystal display device as claimed in claim 4, wherein the temperature adjusting member includes polystyrene resin or polyurethane resin.

6. The liquid crystal display device as claimed in claim 2, wherein each of the plurality of temperature adjusting members include materials having different heat transfer coefficients such that heat transfer coefficients of the plurality of temperature adjusting members decrease from the high-temperature part to the low temperature part in the region where the light emitting diodes are provided.

7. The liquid crystal display device as claimed in claim 1, wherein the plurality of temperature adjusting members are provided at a surface of the frame such that the plurality of temperature adjusting members are spaced apart from each other by a distance lengthwise and widthwise of the frame, and a thickness of the plurality of temperature adjusting members increases from a high-temperature part toward a low-temperature part in the region where the light emitting diodes are provided, thereby sequentially increasing heat resistance values of the plurality of temperature adjusting members from the high-temperature part to the low temperature part in a region where the light emitting diodes are provided.

8. The liquid crystal display device as claimed in claim 7, wherein each of the temperature adjusting members includes an insulating material.

9. The liquid crystal display device as claimed in claim 8, wherein the temperature adjusting member includes polystyrene resin or polyurethane resin.

10. A liquid crystal display device comprising:
a backlight unit, wherein the backlight unit comprises:
a plurality of light emitting diodes;
a plurality of circuit boards to which the light emitting diodes are attached;
a plurality of temperature adjusting members attached to rear portions of the plurality of circuit boards so as to transfer heat emitted from the light emitting diodes; and
a frame to which the plurality of temperature adjusting members are attached, wherein heat resistances of the plurality of temperature adjusting members varies according to a temperature distribution caused by heat emitted from the light emitting diodes such that the temperature distribution around the light emitting diodes in the liquid crystal display device is uniformly maintained.

11. The liquid crystal display device as claimed in claim 10, wherein the heat resistances of the plurality of temperature adjusting members increases from a high-temperature part to a low-temperature part in a region where the light emitting diodes are attached.

12. The liquid crystal display device as claimed in claim 11, wherein a thickness of the plurality of temperature adjusting members becomes thicker from the high-temperature part to the low-temperature part in a region where the light emitting diodes are mounted.

13. The liquid crystal display device as claimed in claim 10, wherein a thickness of the plurality of temperature adjusting members becomes thicker from an upper center portion of the frame toward an upper peripheral portion of the frame, thereby increasing a heat resistance in the upper peripheral portion of the frame.

14. The liquid crystal display device as claimed in claim 13, wherein the thickness of the plurality of temperature adjusting members becomes thicker from a center of the frame toward both sides of the frame so as to increase a heat resistance toward both sides of the frame, and the thickness of the plurality of temperature adjusting members becomes thicker from an upper portion of the frame toward a lower portion of the frame so as to increase heat resistance in the lower portion of the frame.

15. The liquid crystal display device as claimed in claim 10, wherein a plurality of temperature adjusting members are provided in an elongated shape while being spaced apart from each other by a distance in a longitudinal direction of the frame, and heat resistances of the plurality of temperature adjusting members increases from an upper portion of the frame toward a lower portion of the frame.

16. The liquid crystal display device as claimed in claim 15, wherein a thickness of the plurality of temperature adjusting members becomes thicker from the upper portion of the frame toward of the lower portion of the frame.

17. The liquid crystal display device as claimed in claim 10, wherein a plurality of the temperature adjusting members are spaced apart from each other by a distance lengthwise and widthwise of the frame, and heat transfer coefficients of the plurality of temperature adjusting members are reduced from an upper portion of the frame to a lower portion of the frame, and from a center portion of the frame to both sides of the frame, thereby increasing the heat resistances of the temperature adjusting members in the lower portion and at both sides of the frame.

18. The liquid crystal display device as claimed in claim 17, wherein the thickness of the plurality of temperature adjusting members becomes thicker from the upper portion of the frame to the lower portion of the frame, and from the center portion of the frame to both sides of the frame.

19. The liquid crystal display device as claimed in claim 10, wherein the plurality of temperature adjusting members are attached to only a portion of the plurality of circuit boards, and a circuit board without having a temperature adjusting member attached thereto is directly attached to the frame such that heat conductivity toward the frame is greater for the circuit board which is directly attached to the frame than for a circuit board which is attached to a temperature adjusting member.

20. A backlight unit comprising:
a plurality of light emitting diodes; and
a plurality of temperature adjusting members which reduce a temperature difference formed by emission of heat of the backlight unit, the heat being caused by a convection current of air in a vicinity of the light emitting diodes and by heat emitted from the plurality of light emitting diodes,
wherein thicknesses of the plurality of temperature adjusting members are increased from a high-temperature part toward a low-temperature part in a region where the light emitting diodes are distributed so that the temperature difference formed between the high-temperature part and the low-temperature part is reduced.

21. A backlight unit comprising:
a plurality of light emitting diodes;
a plurality of temperature adjusting members which reduce a temperature difference formed by emission of heat of the backlight unit, the heat being caused by a convection current of air in a vicinity of the light emitting diodes and by heat emitted from the plurality of light emitting diodes,
a plurality of circuit boards equipped with the light emitting diodes, the plurality of temperature adjusting members being attached to the plurality of circuit boards; and
a frame on which the plurality of circuit boards and the plurality of temperature adjusting members are installed, wherein heat resistances of the plurality of temperature adjusting members increase from a high-temperature part toward a low-temperature part in a region where the light emitting diodes are mounted.

22. The backlight unit as claimed in claim 21, wherein each of the plurality of temperature adjusting members includes a thermal insulator, and a thickness of the plurality of temperature adjusting members sequentially increases from the high-temperature part toward the low-temperature part in the region where the light emitting diodes are mounted.

23. The backlight unit as claimed in claim 21, wherein thermal conductivity of the plurality of temperature adjusting members sequentially decreases from the high-temperature part toward the low-temperature part in the region where the light emitting diodes are mounted.

24. The backlight unit as claimed in claim 21, wherein the light emitting diodes are distributed from the high-temperature part to the low-temperature part, where the high-temperature part is an upper part of the backlight unit and the low-temperature part is a lower part of the backlight unit.

25. A liquid crystal display device comprising:
a light guide plate which guides light;
a plurality of light emitting diodes which are provided in a vicinity of the light guide plate so as to irradiate light toward the light guide plate;
a plurality of circuit boards which are provided with the light emitting diodes;
a frame on which the circuit boards are installed; and
a plurality of temperature adjusting members provided between the circuit boards and the frame, wherein the plurality of temperature adjusting members have different heat resistances according to an installation position thereof such that a temperature distribution formed in a vicinity of the plurality of circuit boards due to heat radiation of the plurality of light emitting diodes is uniformly maintained.

26. The liquid crystal display device as claimed in claim 25, wherein the plurality of temperature adjusting members are provided in a pad shape between the plurality of circuit boards and the frame, and heat resistances of the plurality of temperature adjusting members installed in a high-temperature part, on which emission heat from the plurality of light emitting diodes is concentrated, is lower than heat resistances of the plurality of temperature adjusting members installed at a low-temperature part, on which the emitted heat is scattered, thereby reducing a temperature difference between the high-temperature part and the low-temperature part.

27. The liquid crystal display device as claimed in claim 25, wherein the plurality of circuit boards includes a first circuit board provided at an upper portion of the light guide plate and a second circuit board provided at an lower portion of the light guide plate, and the plurality of temperature adjusting members includes a first temperature adjusting member attached to the first circuit board and a second temperature adjusting member attached to the second circuit board, and a heat resistance of a first temperature adjusting member arranged on the first circuit board is lower than a heat resistance of a second temperature adjusting member arranged on the second circuit board.

28. The liquid crystal display device as claimed in claim 27, wherein the first circuit board is divided into a plurality of first circuit board groups and the second circuit board is divided into a plurality of second circuit board groups, and the first temperature adjusting member is divided into a plurality of first temperature adjusting member groups, corresponding to the first circuit board groups, and the second temperature adjusting member is divided into a plurality of second circuit board groups, corresponding to the second circuit board groups, and temperature adjusting members in center portions of the first and second circuit board groups, respectively, have a heat resistance lower than a heat resistance of temperature adjusting members arranged at peripheral portions of the first and second circuit board groups, respectively.

29. The liquid crystal display device as claimed in claim 27, wherein each of the plurality of temperature adjusting members includes a pad having an insulating material, and a thickness of the first temperature adjusting member is thinner than a thickness of the second temperature adjusting member.

30. The liquid crystal display device as claimed in claim 29, wherein each of the plurality of temperature adjusting members includes polystyrene resin or polyurethane resin.

31. The liquid crystal display device as claimed in claim 27, wherein a heat transfer coefficient of the first temperature adjusting member is lower than a heat transfer coefficient of the second temperature adjusting member such that heat dissipation in the first circuit board is achieved more easily than heat dissipation in the second circuit board is achieved.

* * * * *